United States Patent
Chu et al.

(10) Patent No.: US 8,242,677 B2
(45) Date of Patent: Aug. 14, 2012

(54) COMBINATION ORGANIC LIGHT EMITTING DIODE PANEL AND GROUNDING UNIT

(75) Inventors: Hye Yong Chu, Daejeon (KR); Jeong Ik Lee, Gyeonggi-do (KR); Doo Hee Cho, Daejeon (KR); Jun Han Han, Daejeon (KR); Joo Won Lee, Seoul (KR); Jin Wook Shin, Incheon (KR); Jong Hee Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/105,345

(22) Filed: May 11, 2011

(65) Prior Publication Data

US 2011/0279021 A1  Nov. 17, 2011

(30) Foreign Application Priority Data

May 12, 2010  (KR) ......................... 10-2010-0044437

(51) Int. Cl.
*H01J 1/52*     (2006.01)
*H01J 19/40*    (2006.01)

(52) U.S. Cl. ........................................ 313/313; 313/358
(58) Field of Classification Search .................. 313/313, 313/504, 358, 512; 428/690
See application file for complete search history.

(56) References Cited

U.S. PATENT DOCUMENTS

2008/0266820 A1* 10/2008 Jairazbhoy et al. ........... 361/753

FOREIGN PATENT DOCUMENTS

| KR | 2003-0011986 A | 2/2003 |
| KR | 2003-0022470 A | 3/2003 |
| KR | 2008-0044445 A | 5/2008 |

* cited by examiner

*Primary Examiner* — Mariceli Santiago
*Assistant Examiner* — Glenn Zimmerman
(74) *Attorney, Agent, or Firm* — Rabin & Berdo, P.C.

(57) ABSTRACT

Provided is an organic light emitting diode (OLED) panel for lighting, including an organic layer emitting light by reaction in response to power supplied by a positive electrode and a negative electrode, a protection cap protecting the organic layer from external moisture and oxygen, a cover film attached to upper surfaces of the positive electrode and negative electrode, and serving as a ground for the positive electrode and the negative electrode, and a conductive metal layer grounding the positive electrode and the negative electrode to the cover film.

8 Claims, 5 Drawing Sheets

COMBINATION ORGANIC LIGHT EMITTING DIODE PANEL AND GROUNDING UNIT

CROSS-REFERENCE TO RELATED APPLICATION

This application claims priority to and the benefit of Korean Patent Application No. 10-2010-0044437, filed May 12, 2010, the disclosure of which is incorporated herein by reference in its entirety.

BACKGROUND

1. Field of the Invention

The present invention relates to an organic light emitting diode (OLED) panel for lighting, and more particularly, to an OLED panel for lighting including a cover film for preventing damage caused by static electricity.

2. Discussion of Related Art

Recently, OLEDs have attracted attention as environmentally friendly lighting which can save energy.

However, when an OLED panel is used as lighting, at least a certain area of the panel is required to ensure the speed of light. Here, since a vertical OLED panel has a structure of a positive electrode, an organic layer, and a negative electrode, and the organic layer has permittivity ($\epsilon$) in picofarads (pF) to microfarads ($\mu$F), capacitance is proportional to the size of the OLED panel.

In addition, since the thickness of the organic layer is very small, for example, ranging from 100 to 300 nm, the static electricity generated according to an external environment fatally damages the OLED panel.

FIG. 1 is a cross-sectional view of the structure of a common OLED panel for lighting.

Referring to FIG. 1, a common OLED panel 100 for lighting includes a substrate 110, a transparent electrode layer 120, an organic layer 130, and a metal electrode layer 140. Here, the organic layer 130 has a thickness of 100 to 800 nm.

A positive electrode 152 connected with the metal electrode layer 140 is formed on one side of the transparent electrode layer 120, and a negative electrode 154 is formed on the other side of the transparent electrode layer 120.

In addition, the entire surface of the OLED panel for lighting 100 is covered with a protection cap 160 to protect the OLED panel for lighting 100 from external moisture and oxygen.

The OLED panel for lighting is manufactured on a mother board and divided into a corresponding size before use. FIG. 2 illustrates a procedure of dividing the OLED panel for lighting from the mother board.

Referring to FIG. 2, the OLED panel for lighting is aligned on the mother board 200 as shown in (a), and divided into separate panels 100 along cutting lines as shown in (b). Here, each panel 100 is designed to have a large emitting region to ensure a certain speed of light, compared to an OLED panel for displays, and thus has a larger capacitance.

However, the panel 100 can be damaged due to static electricity while being divided from the mother board 200, stored and delivered.

SUMMARY OF THE INVENTION

The present invention is directed to an OLED panel for lighting that is protected from static electricity capable of fatally damaging it during storage and distribution thereof.

One aspect of the present invention provides an OLED panel for lighting, including: an organic layer emitting light by reaction in response to power supplied by a positive electrode and a negative electrode; a protection cap protecting the organic layer from external moisture and oxygen; a cover film attached to upper surfaces of the positive electrode and negative electrode, and serving as a ground for the positive electrode and the negative electrode; and a conductive metal layer grounding the positive electrode and the negative electrode to the cover film.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. For clarity, a part that is not related to the description of the present invention will be omitted, and similar part will be represented by a similar reference mark throughout the specification.

Throughout the specification, when a part "includes" or "comprises" a component, the part may include, not remove, another element, unless otherwise defined. In addition, the term "part" or "unit" used herein means a unit processing at least one function or operation.

Figure 1:
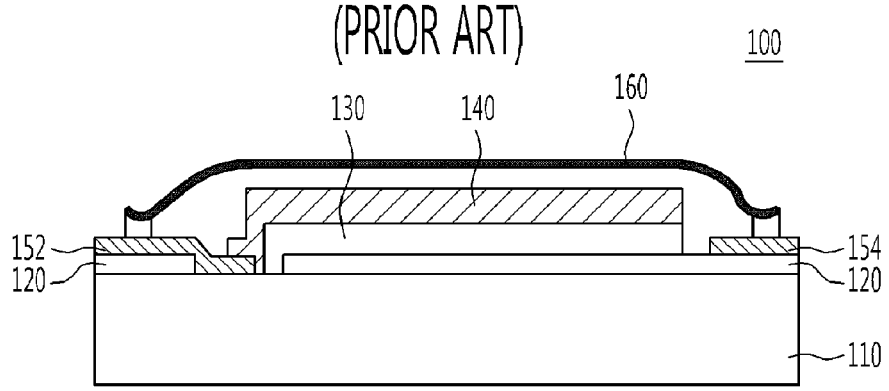
FIG. 1 is a cross-sectional view of the structure of a common OLED panel for lighting.
Figure 2:
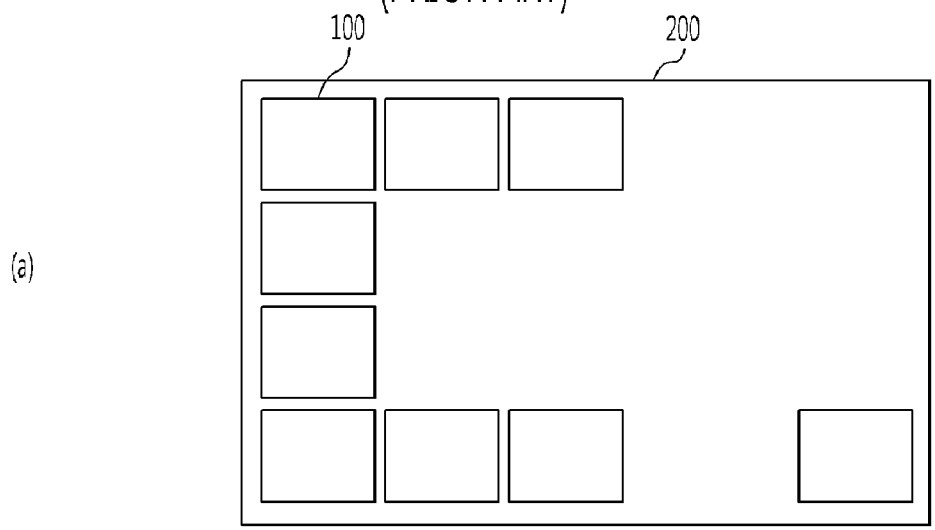
FIG. 2 illustrates a procedure of dividing an OLED panel for lighting on a mother board.
Figure 2:
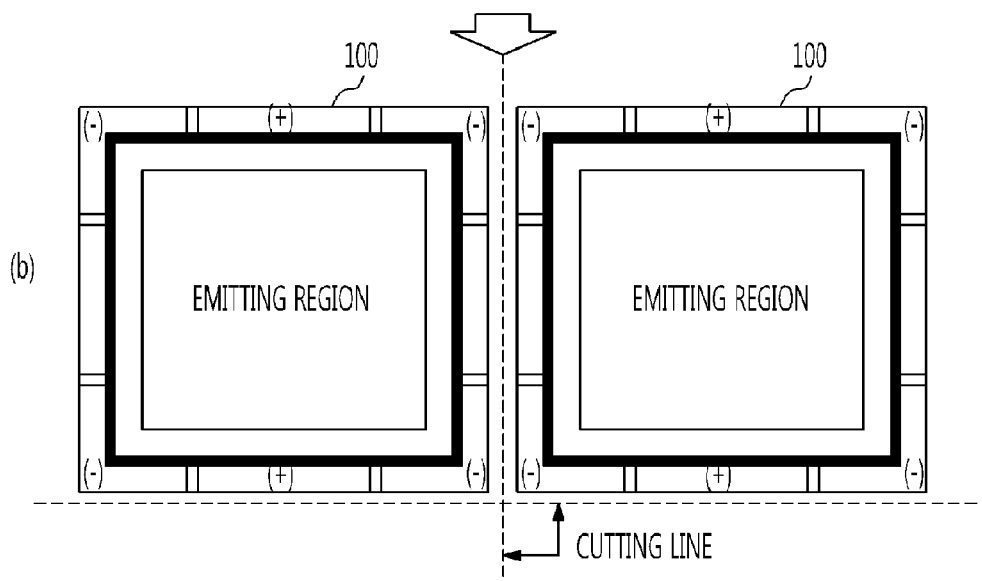
Figure 3:
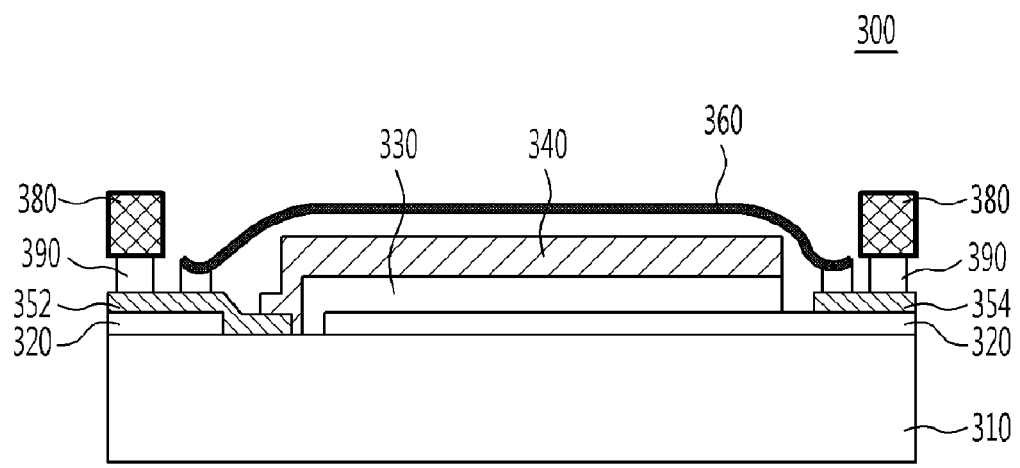
FIG. 3 is a cross-sectional view of an OLED panel for lighting according to a first exemplary embodiment of the preset invention.
Figure 4:
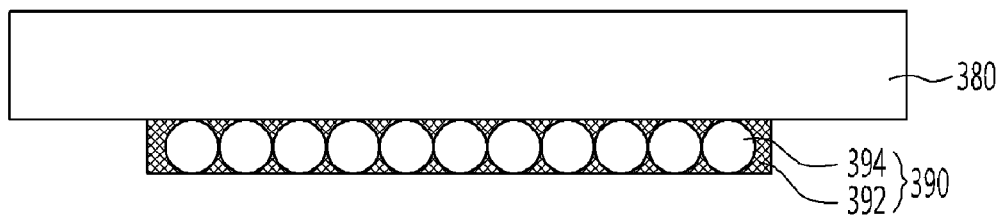
FIG. 4 is a cross-sectional view of a cover film and a conductive metal layer according to the first exemplary embodiment of the present invention.

FIG. 3 is a cross-sectional view of an OLED panel for lighting according to a first exemplary embodiment of the preset invention, and FIG. 4 is a cross-sectional view of a cover film and a conductive metal layer according to the first exemplary embodiment of the present invention.

Referring to FIGS. 3 and 4, an OLED panel for lighting 300 according to the first exemplary embodiment of the present invention includes a substrate 310, a transparent electrode layer 320, an organic layer 330, and a metal electrode layer 340, which are included in a common OLED panel for lighting, and further includes a cover film 380 for protecting the OLED panel for lighting 300 from external static electricity and a conductive metal layer 390.

A positive electrode 352 connected with the metal electrode layer 340 is formed on one side of the transparent electrode layer 320, and a negative electrode 354 is formed on the other side of the transparent electrode layer 320. Thus, the organic layer 330 is reacted by power supplied through the positive electrode 352 and the negative electrode 354, thereby emitting light.

Moreover, the entire surface of the OLED panel for lighting 300 is covered with a protection cap 360 to protect the OLED panel 300 for lighting from external moisture and oxygen.

The cover film 380 serves as the ground for the positive electrode 352 and the negative electrode 354. Thus, the cover film 380 may be formed of a polymer material containing at least one of PET, PC, PEN, PES and PI or an Al- or Cu-containing metal thin film whose surface is covered with the polymer material.

The conductive metal layer 390 is formed of an adhesive material, and attached between the positive electrode 352, the negative electrode 354, and the cover film 380 to ground the positive electrode 352 and the negative electrode 354 to the cover film 380. To this end, the conductive metal layer 390 includes an adhesive 392 and metal powder 394. Here, the metal powder 394 includes carbon, nickel, copper, and silver powder.

Figure 5:
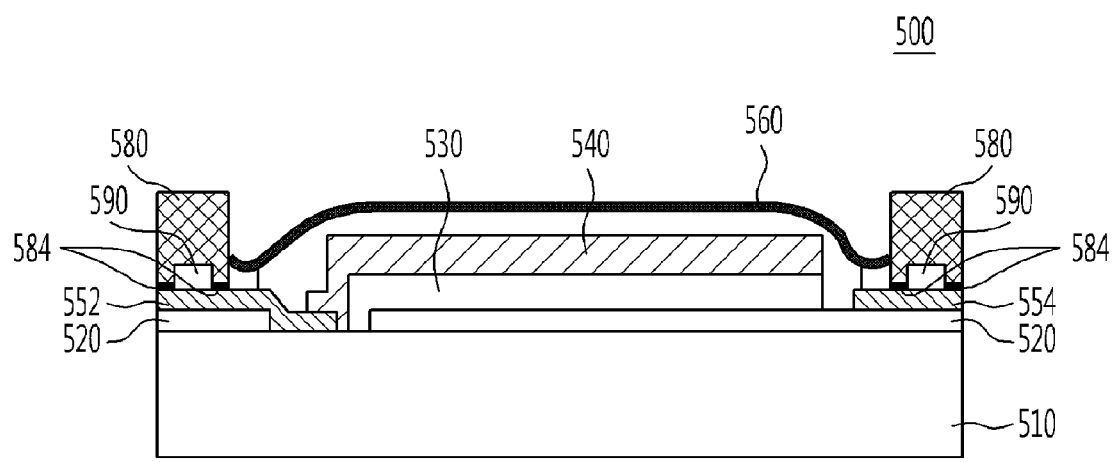
FIG. 5 is a cross-sectional view of an OLED panel for lighting according to a second exemplary embodiment of the present invention.
Figure 6:
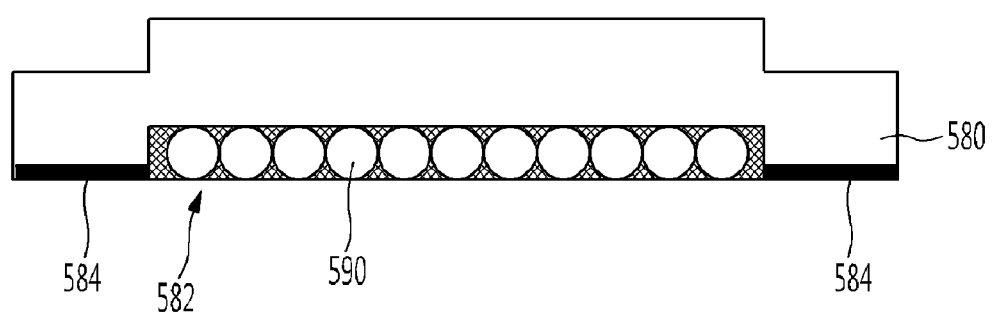
FIG. 6 is a cross-sectional view of a cover film and a conductive metal layer according to the second exemplary embodiment of the present invention.

FIG. 5 is a cross-sectional view of an OLED panel for lighting according to a second exemplary embodiment of the present invention, and FIG. 6 is a cross-sectional view of a cover film and a conductive metal layer according to the second exemplary embodiment of the present invention.

Referring to FIG. 5, an OLED panel for lighting 500 according to the second exemplary embodiment of the present invention is formed in the same structure as that of FIG. 3, except that a connecting structure of a cover film 580 and a conductive metal layer 590 is different from that in the OLED panel for lighting 300 of FIG. 3.

In other words, the cover film 580 according to the second exemplary embodiment has a groove 582 in a region attached to a positive electrode 552 or a negative electrode 554 as shown in FIG. 6, and the conductive metal layer 590 is formed in the groove 582. Here, the conductive metal layer 590 includes carbon, nickel, copper, and silver powder.

The cover film 580 is attached to upper surfaces of the positive electrode 552 and the negative electrode 554 using separate adhesives 584, so as to serve as the ground for the positive electrode 552 and the negative electrode 554. Thus, the cover film 580 may protect the OLED panel for lighting 500 from external static electricity. To this end, the cover film 580 may be formed of a polymer material containing at least one of PET, PC, PEN, PES and PI or an Al- or Cu-containing metal thin film whose surface is covered with the polymer material.

Figure 7:
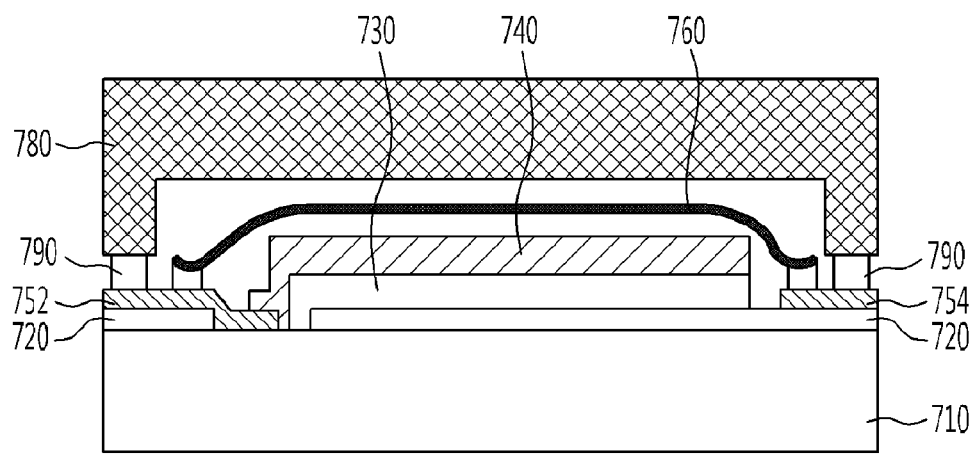
FIG. 7 is a cross-sectional view of an OLED panel for lighting according to a third exemplary embodiment of the present invention.

FIG. 7 is a cross-sectional view of an OLED panel for lighting according to a third exemplary embodiment of the present invention.

Referring to FIG. 7, an OLED panel for lighting 700 according to the third exemplary embodiment of the present invention is formed in the same structure as that of FIG. 3, except that a cover film 780 is formed in a housing structure covering the entire OLED panel for lighting 700, and attached to upper surfaces of a positive electrode 752 and a negative electrode 754 using a conductive metal layer 790. Thus, the positive electrode 752 and the negative electrode 754 of the OLED panel for lighting 700 may be grounded to the cover film 780, so as to prevent damage to the OLED panel for lighting 700 due to static electricity. In addition, since the cover film 780 covers the entire OLED panel for lighting 700, external static electricity can be basically blocked.

Figure 8:
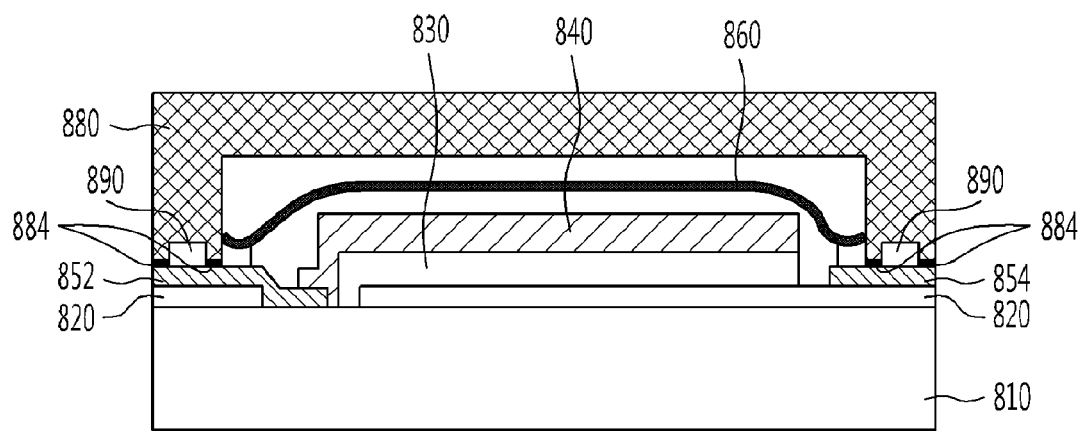
FIG. 8 is a cross-sectional view of an OLED panel for lighting according to a fourth exemplary embodiment of the present invention.

FIG. 8 is a cross-sectional view of an OLED panel for lighting according to a fourth exemplary embodiment of the present invention.

Referring to FIG. 8, an OLED panel for lighting 800 according to the fourth exemplary embodiment of the present invention is formed in the same structure as that of FIG. 5, except that a cover film 880, like FIG. 7, is formed in a housing structure covering the entire OLED panel for lighting 800, and attached to upper surfaces of a positive electrode 852 and a negative electrode 854 using a conductive metal layer 890. Thus, the positive electrode 852 and the negative electrode 854 of the OLED panel for lighting 800 may be grounded to the cover film 880, so as to prevent damage to the OLED panel for lighting 800 due to static electricity. In addition, since the cover film 880 covers the entire OLED panel for lighting 800, external static electricity can be basically blocked.

Figure 9:
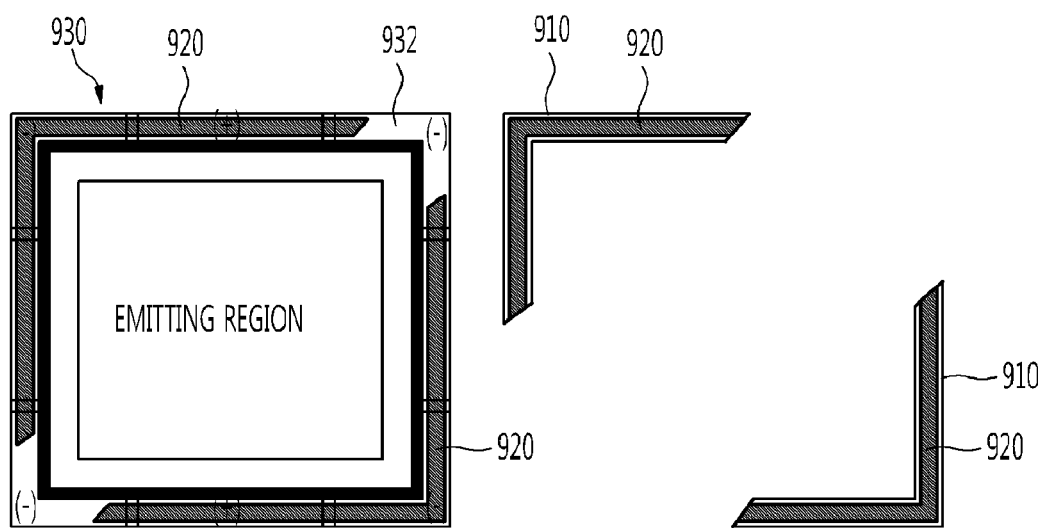
FIG. 9 is a plan view of the cover film and the OLED panel for lighting according to the first and third exemplary embodiments of the present invention.

FIG. 9 is a plan view of the cover film and the OLED panel for lighting according to the first and third exemplary embodiments of the present invention.

Referring to FIG. 9, a cover film 910 according to the first and third exemplary embodiments of the present invention may be formed in various shapes including "⌐," "¬," "⌙" and "L" according to the shape of an electrode region 932 of the OLED panel for lighting 930, and attached to one side of the electrode region 932 of the OLED panel for lighting 930. Thus, the electrode region 932 of the OLED panel for lighting 930 is grounded to the cover film 910, and thus prevents damage to the OLED panel for lighting 930 due to static electricity.

Figure 10:
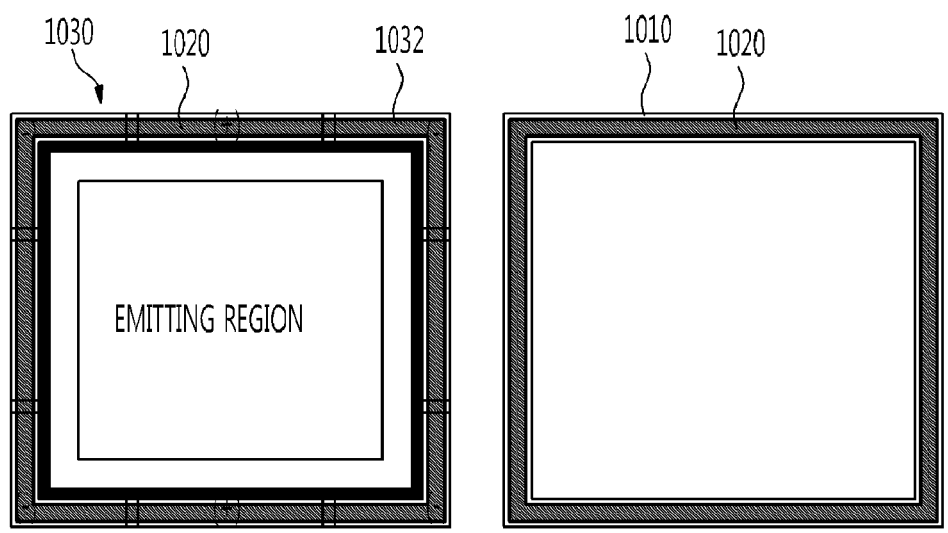
FIG. 10 is a plan view of the cover film and the OLED panel for lighting according to the second and fourth exemplary embodiments of the present invention.

FIG. 10 is a plan view of the cover film and the OLED panel for lighting according to the second and fourth exemplary embodiments of the present invention.

Referring to FIG. 4, a cover film 1010 according to the second and fourth exemplary embodiments of the present invention is formed in a housing structure covering the entire OLED panel for lighting 1030, and has a conductive metal layer 1020 in a boundary region (region corresponding to an electrode region 1032 of the OLED panel for lighting 1030). Using the conductive metal layer 1020, the cover film 1010 is attached to the OLED panel for lighting 1030. As a result, the electrode region 1032 of the OLED panel for lighting 1030 is grounded to the cover film 1010, and the damage to the OLED panel for lighting 1030 due to static electricity can be prevented. In addition, the cover film 1010 can cover the entire OLED panel for lighting 1030, thereby basically blocking external static electricity.

Consequently, according to the present invention described above, an electrode region in an OLED panel for lighting is grounded to a cover film using a conductive metal layer. For this reason, the OLED panel for lighting does not need a separate pattern for grounding, and can be protected from static electricity which can be generated while manufacturing, storing and delivering the OLED panel for lighting. Thus, the present invention can provide a high quality OLED panel for lighting.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A combination of an organic light emitting diode (OLED) panel and a grounding unit, the OLED panel comprising:
   an organic layer operable to emit light by reaction in response to power supplied through a positive electrode and a negative electrode; and
   a protection cap protecting the organic layer from external moisture and oxygen,
   the grounding unit attached to the OLED panel for protecting the OLED panel from static electricity when the OLED panel is not in operation, the grounding unit comprising:
   a cover film attached to upper surfaces of the positive electrode and the negative electrode, and serving as a ground for the positive electrode and the negative electrode; and
   a conductive metal layer grounding the positive electrode and the negative electrode to the cover film; wherein the OLED panel is not capable of operation with the grounding unit attached.

2. The combination of claim 1, wherein the cover film is formed of an Al- or Cu-containing metal thin film.

3. The combination of claim 1, wherein the conductive metal layer is inserted between the positive electrode and the cover film, and between the negative electrode and the cover film.

4. The combination of claim 3, wherein the conductive metal layer includes an adhesive and metal powder.

5. The combination of claim 4, wherein the metal powder includes at least one of nickel, copper and silver powders.

6. The combination of claim 1, wherein the cover film has a groove in a region attached to the positive electrode or the negative electrode, and the conductive metal layer is formed in the groove.

7. The combination of claim 6, wherein the conductive metal layer includes at least one of nickel, copper and silver powders.

8. The combination of claim 1, wherein the cover film is formed in a housing structure covering the entire OLED panel for lighting.

* * * * *